(12) United States Patent
R R

(10) Patent No.: US 11,349,456 B2
(45) Date of Patent: May 31, 2022

(54) ULTRA-LOW ENERGY PER CYCLE OSCILLATOR TOPOLOGY

(71) Applicant: Texas Instruments Incorporated, Dallas, TX (US)

(72) Inventor: Manikandan R R, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 15/958,980

(22) Filed: Apr. 20, 2018

(65) Prior Publication Data

US 2019/0028089 A1 Jan. 24, 2019

(30) Foreign Application Priority Data

Jul. 21, 2017 (IN) .............................. 201741025967

(51) Int. Cl.
| | | |
|---|---|---|
| *H03K 3/03* | (2006.01) | |
| *H03K 3/012* | (2006.01) | |
| *H03K 3/353* | (2006.01) | |
| *H03K 3/354* | (2006.01) | |
| *H03K 5/04* | (2006.01) | |
| *H03K 5/00* | (2006.01) | |

(52) U.S. Cl.
CPC ............. *H03K 3/012* (2013.01); *H03K 3/353* (2013.01); *H03K 3/354* (2013.01); *H03K 5/04* (2013.01); *H03K 5/00* (2013.01); *H03K 2005/00195* (2013.01)

(58) Field of Classification Search
CPC .......... H03K 3/012; H03K 3/353; H03K 5/00; H03K 2005/00195; H03K 5/04; H03K 3/354

USPC ........................................................... 331/57
See application file for complete search history.

(56) References Cited

U.S. PATENT DOCUMENTS

| | | | | | |
|---|---|---|---|---|---|
| 3,631,528 A | * | 12/1971 | Green | ................ | H03K 19/0013 326/84 |
| 4,785,203 A | * | 11/1988 | Nakamura | .......... | H03K 19/0948 326/87 |
| 5,414,379 A | * | 5/1995 | Kwon | .............. | H03K 19/00361 327/170 |

(Continued)

OTHER PUBLICATIONS

Xiaodan Zou et al, "A 1-V 450-nW Fully Integrated Programmable Biomedical Sensor Interface Chip", IEEE Journal of Solid-State Circuits, vol. 44, No. 4, Apr. 2009, pp. 1067-1077.

(Continued)

*Primary Examiner* — Richard Tan
(74) *Attorney, Agent, or Firm* — Brian D Graham; Charles A. Brill; Frank D. Cimino

(57) ABSTRACT

In described examples of an integrated circuit (IC), an oscillator includes Schmitt trigger delay cells connected in a ring topology. The Schmitt trigger delay cells have a high input threshold approximately equal to Vdd and a low input threshold approximately equal to Vss to increase delay through each cell. An output buffer receives a phase signal from an output terminal of one of the Schmitt trigger delay cells and converts a transition phase signal to a faster transition clock signal. The output buffer has control circuitry that generates non-overlapping control signals in response to the phase signal, to control an output stage to generate the fast transition clock signal while preventing short circuit current in the output stage.

13 Claims, 9 Drawing Sheets

(56) References Cited

U.S. PATENT DOCUMENTS

| | | | | |
|---|---|---|---|---|
| 5,666,088 A * | 9/1997 | Penza | ................. | H03K 3/013 331/175 |
| 6,204,708 B1 * | 3/2001 | Alexander | ........... | H03K 3/0372 327/203 |
| 6,304,120 B1 * | 10/2001 | Taito | ................. | H03K 5/08 327/112 |
| 6,448,830 B1 * | 9/2002 | Chuang | ................. | H03K 3/3565 327/205 |
| RE38,274 E * | 10/2003 | Boudry | ................. | H03K 3/0315 327/264 |
| 6,683,482 B2 * | 1/2004 | Humphrey | ............... | H03K 5/12 326/26 |
| 6,958,631 B2 * | 10/2005 | Aiba | ................. | G11B 7/126 327/112 |
| 7,205,855 B2 * | 4/2007 | Maruyama | ........... | H03K 3/0315 331/57 |
| 8,519,778 B2 * | 8/2013 | Yamahira | ......... | H03K 19/00361 327/536 |
| 10,036,773 B1 * | 7/2018 | Ghosh | ................. | G01R 31/2832 |
| 2003/0179183 A1 * | 9/2003 | Lee | ................. | G06F 1/3259 345/163 |
| 2005/0174183 A1 * | 8/2005 | Tachibana | ............. | H03B 5/364 331/158 |
| 2014/0273856 A1 * | 9/2014 | Kyles | ................. | H04B 1/401 455/41.2 |
| 2015/0326235 A1 * | 11/2015 | Pavao-Moreira | ....... | H03L 7/099 331/57 |
| 2016/0072514 A1 * | 3/2016 | Tsai | ................. | H03B 27/00 331/47 |
| 2017/0194944 A1 * | 7/2017 | Hemes | ................. | H03K 3/012 |

OTHER PUBLICATIONS

"MSP430x43x1, MSP430x43x, MSP430x44x1, MSP430x44x Mixed Signal Microcontroller", SLAS344G, Texas Instruments, Inc., Jan. 2002, Revised Oct. 2009, pp. 1-10.

"TLP5000 Nano-Power Programmable Timer with Watchdog Functionality", TLP5000, SNAS626B, Texas Instruments, Inc., Jul. 2013, Revised Dec. 2014, pp. 1-21.

Tzu-Ming Wang, Ming-Dou Ker, and Hung-Tai Liao, "Design of Mixed-Voltage-Tolerant Crystal Oscillator Circuit in Low-Voltage CMOS Technology", IEEE Transactions on Circuits and Systems-I:Regular Papers, vol. 56, No. 5, May 2009, pp. 966-974.

Dongmin Yooon et al, "A 5.58 nW Crystal Oscillator Using Pulsed Driver for Real-Time Clocks", IEEE Journal of Solid-State Circuits, vol. 51, No. 2, Feb. 2016, pp. 509-522.

Keng-Jan Hsiao, "A 1.89nW/0.15V Self-Charged XO for Real-Time Clock Generation", 2014 IEEE International Solid-State Circuits Conference, Session 17, Analog Techniques 17.7, Feb. 11, 2014, pp. 298-299.

Aatmesh Shrivastava, Divya Akella Kamakshi, and Benton H. Calhoun, "A 1.5 nW, 32.768 kHz XTAL Oscillator Operational From a 0.3 V Supply", IEEE Journal of Solid-State Circuits, vol. 51, No. 3, Mar. 2016, pp. 386-696.

Danielle Griffith et al, A 190nW 33kHz RC Oscillator with +-0.21% Temperature Stability and 4ppm Long-Term 2014 IEEE International Solid-State Circuits Conference, Session 17, Analog Techniques 17.8, Feb. 11, 2014, pp. 300-302.

Arun Paidimarri et al, "An RC Oscillator With Comparator Offset Cancellation", IEEE Journal of Solid-State Circuits, vol. 51, No. 8, Aug. 2016, pp. 1866-1877.

Urs Denier, "Analysis and Design of an Ultralow-Power CMOS Relaxation Oscillator", IEEE Transactions on Circuits and Systems-I:Regular Papers, vol. 57, No. 8, Aug. 2010, pp. 1973-1982.

Takashi Tokairin et al, "A 280nW, 100kHz, 1-Cycle Start-up Time, On-chip CMOS Relaxation Oscillator Employing a Feedforward Period Control Scheme", 2012 Symposium on VLSI Circuits (VLSIC), Jun. 2012, pp. 16-17.

Seokhyeon Jeong et al, "A 5.8 nW CMOS Wake-Up Timer for Ultra-Low-Power Wireless Applications", IEEE Journal of Solid-State Circuits, vol. 50, No. 8, Aug. 2015, pp. 1754-1763.

Vadim Ivanov, Ralf Brederlow, and Johannes Gerber, "An Ultra Low Power Bandgap Operational at Supply From 0.75 V", IEEE Journal of Solid-State Circuits, vol. 47, No. 7, Jul. 2012, pp. 1515-1523.

Phillip M. Nadeau, Arun Paidimarri, and Anantha P. Chandrakasan, "Ultra Low-Energy Relaxation Oscillator With 230 fJ/cycle Efficiency", IEEE Journal of Solid-State Circuits, vol. 51, No. 4, Apr. 2016, pp. 789-799.

Yen-Po Chen et al, "A 2.98nW Bandgap Voltage Reference Using a Self-Tuning Low Leakage Sample and Hold", 2012 Symposium on VLSI Circuits Digest of Technical Papers, pp. 200-201.

Yu-Shiang Lin, Dennis Sylvester, and David Blaauw, "A sub-pW timer using gate leakage for ultra low-power sub-Hz monitoring systems", IEEE 2007 Custom Integrated Circuits Conference, Sep. 16-19, 2007, San Jose, CA, pp. 397-400.

Yoonmyung Lee et al, "A 660pW Multi-Stage Temperature-Compensated Timer for Ultra-Low-Power Wireless Sensor Node Synchronization", 2011 IEEE International Solid-State Circuits Conference, Feb. 21, 2011,pp. 46-48.

Yu-Shiang Lin, Dennis M. Sylvester, and David T. Blaauw, "A 150pW Program-and-Hold Timer for Ultra-Low-Power Sensor Platforms", 2009 IEEE International Solid-State Circuits Conference—Digest of Technical Papers, Feb. 2009, San Francisco, CA, pp. 326-327, 327a.

Aatmesh Shrivastrave and Benton H. Calhoun, "A 150nW, 5ppm/oC, 100khz On-Chip Clock Source for Ultra Low Power SoCs", Proceedings of the IEEE 2012 Custom Integrated Circuits Conference, Sep. 2012, pp. 1-4.

Luiz Alberto Pasini Melek, IEEE Transactions on Circuit and Systems-I:Regular Papers, vol. 64, No. 4, Apr. 2017, p. 869-878.

Yoonmyung Lee et al, "A Sub-nW Multi-stage Temperature Compensated Timer for Ultra-Low-Power Sensor Nodes", IEEE Journal of Solid-State Circuits, vol. 48, No. 10, Oct. 2013, pp. 2511-2521.

* cited by examiner

ULTRA-LOW ENERGY PER CYCLE OSCILLATOR TOPOLOGY

CROSS-REFERENCE TO RELATED APPLICATION

This application claims priority to Indian Provisional Application No. 201741025967, filed Jul. 21, 2017, entitled "Ultra-Low Energy per Cycle Oscillator Topology," which is incorporated by reference herein.

TECHNICAL FIELD

This relates to ultra-low energy per cycle oscillator topology.

BACKGROUND

As the "internet of things" (IoT) becomes more widespread, small portable or autonomous devices are being powered by micro-batteries or energy harvesting systems. In such devices, minimal power consumption is important. An oscillator operating at a low frequency may be used to implement a wake-up timer. In many cases, the low frequency oscillator does not need to have good accuracy.

SUMMARY

In described examples of an integrated circuit (IC), an oscillator includes Schmitt trigger delay cells connected in a ring topology. The Schmitt trigger delay cells are coupled to a first power bus and to a second power bus. The Schmitt trigger delay cells have: a first input switch threshold approximately equal to a voltage provided on the first power bus; and a second input switch threshold approximately equal to a voltage provided on the second power bus.

The oscillator may also include an output buffer having an input coupled to receive a phase signal from an output terminal of one of the Schmitt trigger delay cells. The output buffer has an output stage to provide a clock signal. Also, the output buffer includes pre-drivers to generate non-overlapping control signals to control the output stage in response to the phase signal, in a manner that produces little or no short circuit current in the output stage.

DETAILED DESCRIPTION

Figure 1:
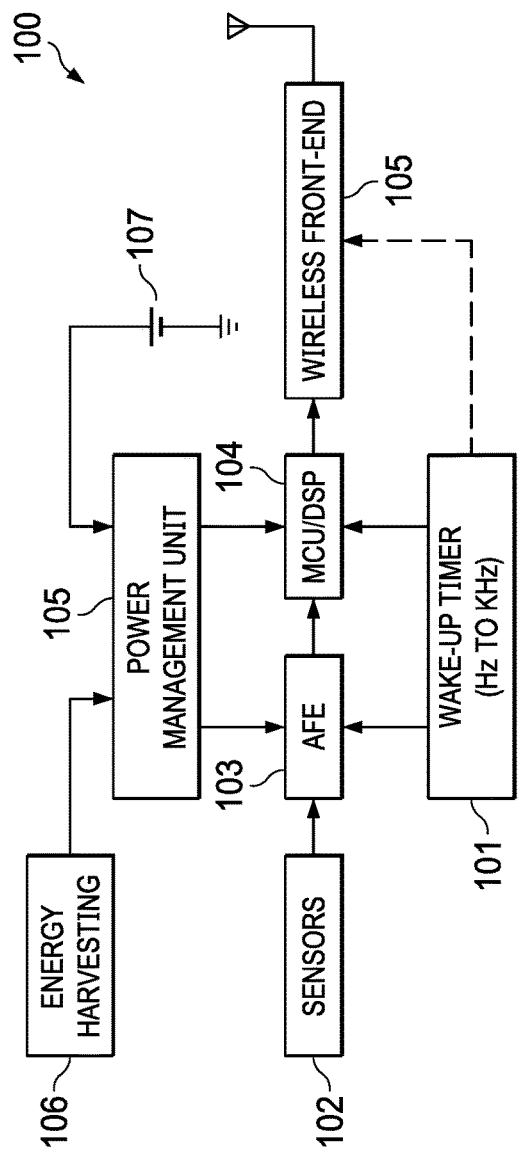
FIG. 1 is a block diagram of an example sensor system that includes an ultra-low power oscillator.

In the drawings, like elements are denoted by like reference numerals for consistency.

Advances in the ultra-low power sensor platforms and Internet-of-Things (IoT) have led to a development of many new applications, such as environmental monitoring systems (temperature/gas/humidity sensors, thermostats, intruder detection, etc.), health monitoring systems (blood glucose and eye pressure monitors, etc.), and other monitoring systems. These systems usually operate from limited energy sources, such as a coin cell or an energy harvested source. Heavily duty-cycled operation with extreme power gating techniques are often used in these systems to reduce the average power consumption and to extend their lifetime. For such applications, a low "standby" or "quiescent current" (Iq) is desirable to attain average power dissipation on the order of nanowatts (nWs).

An example system described herein may achieve an Iq that is only a few nano-amperes (nA). A sample and hold (S/H) technique running on a very low frequency clock may provide good sensor results. For example, an oscillator that generates a low frequency clock signal may be operated in the sub 10 KHz range.

For many applications, an oscillator generating a low frequency clock does not need to have good accuracy. However, because the oscillator must operate continuously, it contributes to Iq, and therefore very low current consumption is beneficial. An example oscillator circuit described herein may use a ring topology of delay elements. The example described herein may use Schmitt trigger delay elements in the ring topology. The Schmitt trigger delay elements are designed to have switching threshold for the input signal that are approximately equal to the high and low supply voltages, in order to increase delay time provided by each delay element and thereby reduce a number of delay elements required to produce a low frequency signal.

The phase signals generated by each of the Schmitt trigger delay elements may have a relatively slow rise and fall time. One of the phase signals may be buffered by a digital buffer to create a clock signal that has a faster rise and fall time for use by other digital logic within an application system. An example ultra-low power non-overlap buffer is described herein that generates non-overlapping control signals, in response to a phase signal with relatively slow transitions, to control an output stage to generate a clock signal that has relatively fast transitions in a manner that essentially blocks short circuit current from flowing in the output stage. The example ultra-low power non-overlap buffer circuit described herein consumes less than 500 pA of current and provides transition times of <10 ns. In this manner, Iq of the example oscillator circuit may be reduced to an extremely low level.

Figure 2:
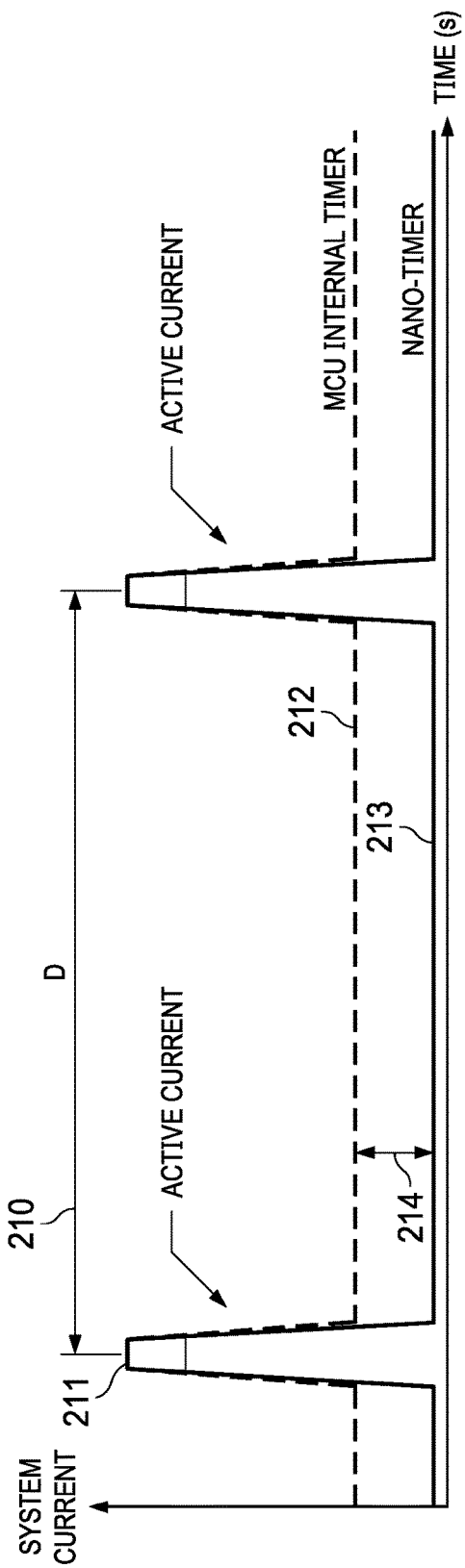
FIG. 2 is a plot of current vs. time for the system of FIG. 1.

FIG. 1 is a block diagram of an example sensor system 100 that includes a wakeup timer 101 that relies on an ultra-low power oscillator. FIG. 2 is a plot illustrating current vs. time for the system of FIG. 1. In this example, wake-up timer 101 performs the duty cycling of sensors 102, analog front end (AFE) 103, micro controller unit (MCU) 104 and wireless transmission circuits 105. Data sensing circuits 102 and transmission circuits 105 may operate with different duty cycles and accuracies, depending on the end target application. Sensors 102, AFE 103, MCU 104 and wireless transmission system 105 may be implemented using known or later developed low power designs. Wakeup timer 101 may be implemented using an ultra-low power oscillator to generate a low frequency clock signal that is described in more detail hereinbelow, along with a counter or other type of state machine to count a certain number of clock cycles and logic to wake up the rest of the system periodically. Power to operate sensor system 100 may be provided by a battery or capacitor 107 and/or by energy harvested from the environment (such as solar, vibration, heat, electromagnetic fields, etc.) by a known or later developed energy harvesting element 106. Power management unit 108 may perform various tasks, such as charging battery/capacitor 107 using harvested energy, adjusting voltage levels provided to system components such as AFE 103 and MCU 104, etc., using known or later developed power management techniques.

Referring to FIG. 2, duty cycle (D) 210 illustrates an example duty cycle for the sensor system 100 of FIG. 1. During sleep mode, standby current consumed mainly by the wakeup timer is low. Each period of system activity causes a current spike, such as illustrated at 211. With the duty cycled active power on the order of low nanowatts, the total system power is dominated by the wakeup timer and standby power consumption. An MCU may have an integrated low power timer circuit to perform system timing during its standby state. However, in conventional MCUs, an integrated system timing may consume over 300 nA, which may produce a total current consumption curve as illustrated by plot 212. Ultra-low power timer 101 (FIG. 1), also referred to herein as "nano timer" 101, may consume less than a few nA to produce a total current consumption curve as illustrated by plot 213. A reduction in quiescent current required to operate nano timer 101 is indicated at 214.

Figure 3A:
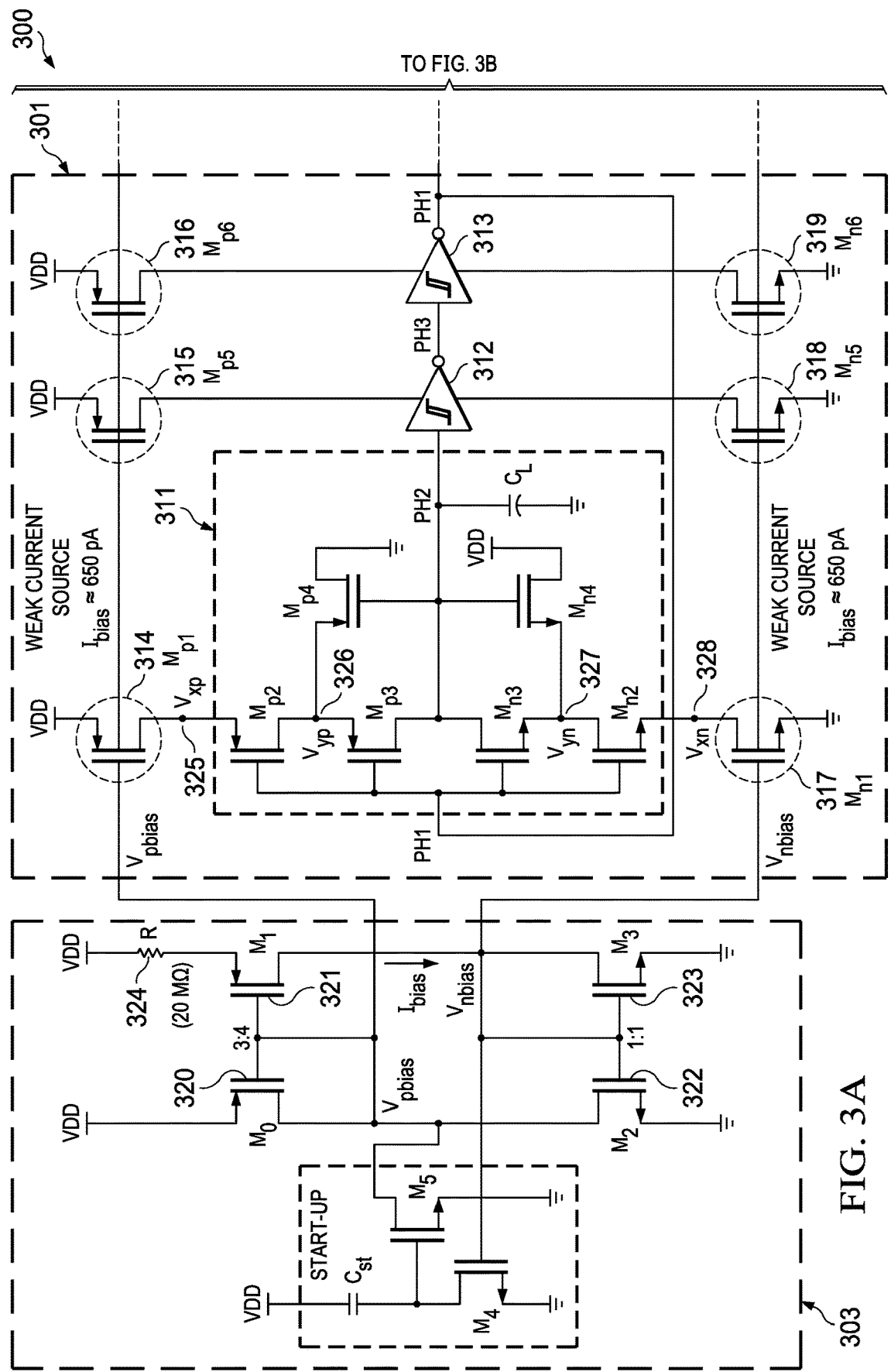
FIG. 3A and FIG. 3B together is a schematic of an example ultra-low power oscillator.
Figure 3B:
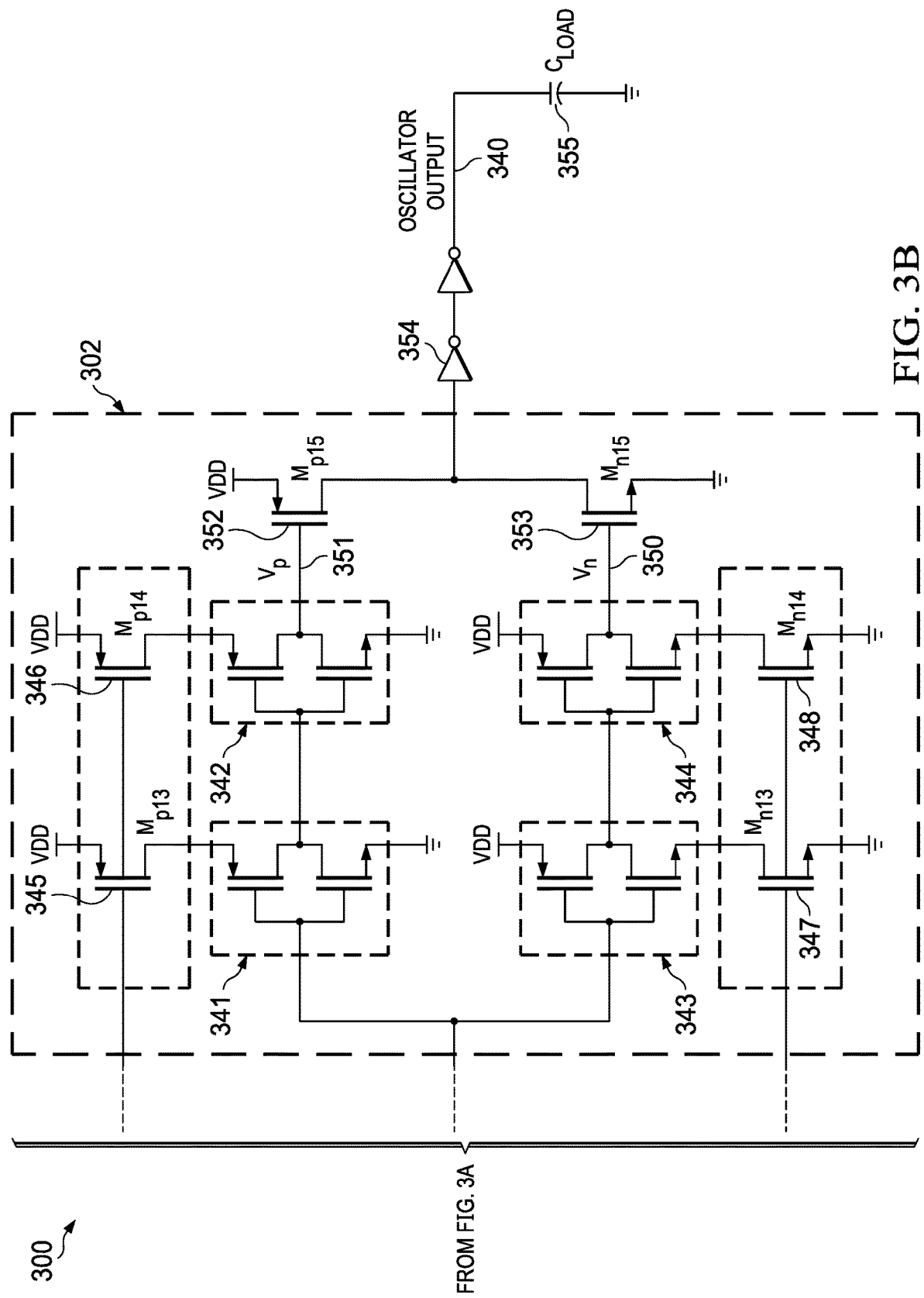

FIG. 3A and FIG. 3B together is a schematic of an example ultra-low power oscillator 300 that may be used to implement nano timer 101 of FIG. 1. In a fast CMOS (complementary metal oxide semiconductor) process, challenges exist for generation of large time constants in a range of milliseconds (ms) to seconds (s) on-chip at sub-10 pico-Joule per clock cycle (pJ/cycle) of energy. To limit or avoid short circuit currents, and to reduce power overhead in bias generation circuits, techniques described herein may allow operation across a wide range of supply voltage and temperature, with ease of portability across process nodes. Example oscillator 300 is an ultra-low energy KHz oscillator circuit. In this description, examples include: circuit techniques to reduce the oscillator energy consumption and to realize larger time-periods using a ring oscillator core 301; and a non-overlap buffer circuit 302 that provides faster transition times at ultra-low currents.

A current starved ring oscillator topology is suitable for ultra low power operations. The example oscillator core 301 uses a three-stage ring oscillator core made of Schmitt trigger delay cells 311, 312 and 313, biased using ultra low magnitude currents provided by weak current sources 314-316. A complete schematic is shown for Schmitt trigger delay element 311. Schmitt trigger delay elements 312 and 313 have a similar circuit. Schmitt trigger delay element 311 receives supply current from a voltage supply buss (Vdd) via weak current source 314 that is a p-type MOS transistor. Weak current source 317 is an n-type MOS transistor that returns current to ground voltage buss (Vss). Similar weak current sources 315, 316, 318, 319 are coupled to supply a limited supply current to Schmitt trigger delay elements 312, 313. Each weak current source 314-319 is coupled to bias current generator 303 and is configured to operate as a current mirror to mirror the bias current produced by bias current generator 303. In this example, bias current generator 303 produces a bias current that is approximately 650 pA. This example has three Schmitt trigger delay elements, but another example may have more Schmitt trigger delay elements to create a periodic signal that has a longer period. Likewise, fewer delay elements may be used to create a periodic signal that has a shorter period.

Bias Generator

Bias current generator 303 provides an approximately 650 pA reference current (Ibias) to the oscillator current sources 314-319 and to current sources 345-348, which are used with buffer circuit 302. Bias current generator 303 determines the power consumption of the oscillator stages and adds to the power overhead. A very low value for Ibias (on the order of sub-nAs) is preferred to achieve an ultra-low power operation and to generate larger delay values.

This example uses a β-multiplier reference current generator circuit to generate a bias current (Ibias) of approximately 650 pA. Transistors 320-323 (M0-M3) operate in the subthreshold region, and Ibias generated can be calculated as shown in expression (1).

$$\text{Ibias} = (nV_T/R) \cdot \ln(K) \tag{1}$$

where n is the subthreshold slope factor, VT is the thermal voltage, and K is a ratio of aspect ratios of the transistors M1/M0. For K=4/3, n is approximately equal to 1.721, VT=25.85 mV at 27 C, R=20 MΩ, and Ibias can be calculated to be 640 pA from the expression (1). Resistor 324 (R) may be implemented in a binary weighted form to trim for process (±90 pA) and mismatch (±300 pA, 3-sigma) variations in Ibias.

Figure 4:
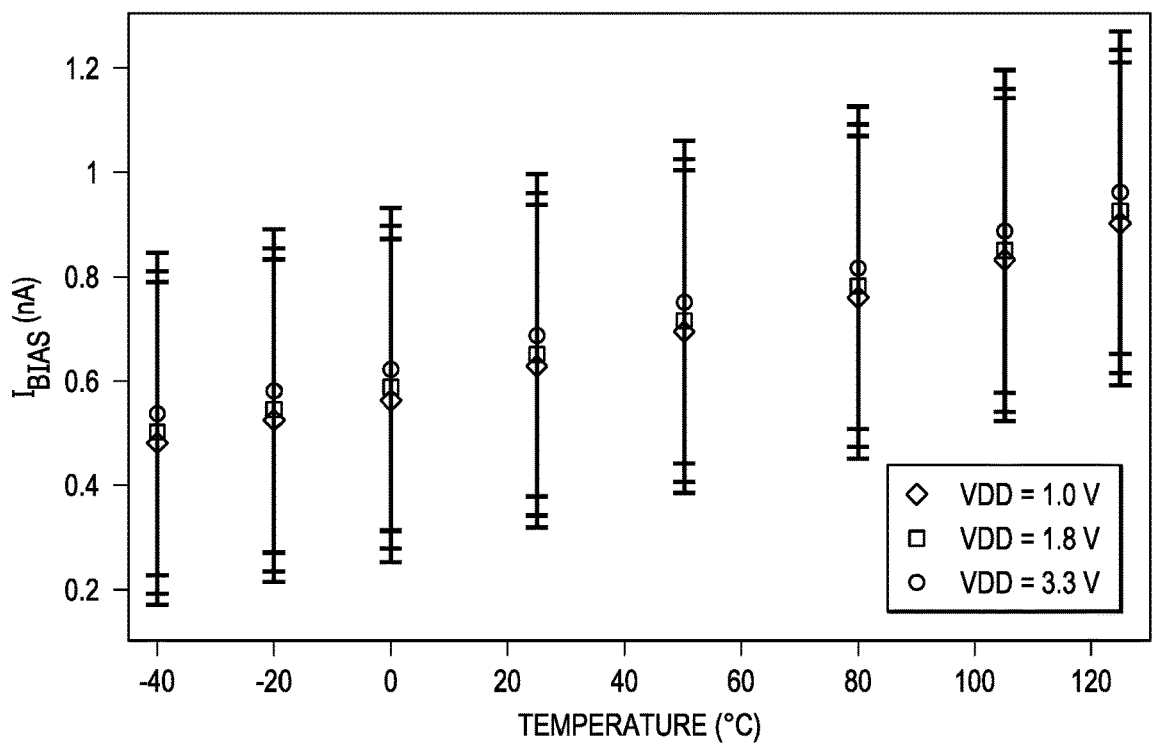
FIG. 4 is plot of bias current vs. temperature for the example oscillator of FIG. 3A, FIG. 3B.

FIG. 4 shows simulated Ibias characteristics with mismatch across an operating temperature range of −40 C to 125 C and a supply voltage range of 1.0V to 3.3V. The bias current that flows through resistor 324 is proportional to absolute temperature (PTAT).

Oscillator

FIG. 3A shows a three-stage current starved oscillator core 301 and the detailed circuit of delay cell 311. This example has inverting Schmitt trigger delay cells, because of their immunity to noise and disturbances. However, in another example, non-inverting delay cells may be implemented. An N-stage oscillator core, biased with a reference current of Ibias (650 pA), consumes a total average current of approximately N*Ibias/2=(975 pA), due to the periodic operation of each delay cell.

Conventionally, one or more of the following options could be used for generating a very low frequency timing signal in a ring oscillator topology: (a) low magnitude bias currents; (b) larger number of delay stages at a cost of increased current consumption; and/or (c) a large load capacitance (CL) (pFs) at a cost of increased chip area. In the example oscillator 301, a larger delay per stage is generated by using an ultra-low magnitude Ibias of 650 pA, accompanied by the CMOS Schmitt trigger high and low threshold levels being set at approximately the supply and ground voltages, respectively.

Figure 5:
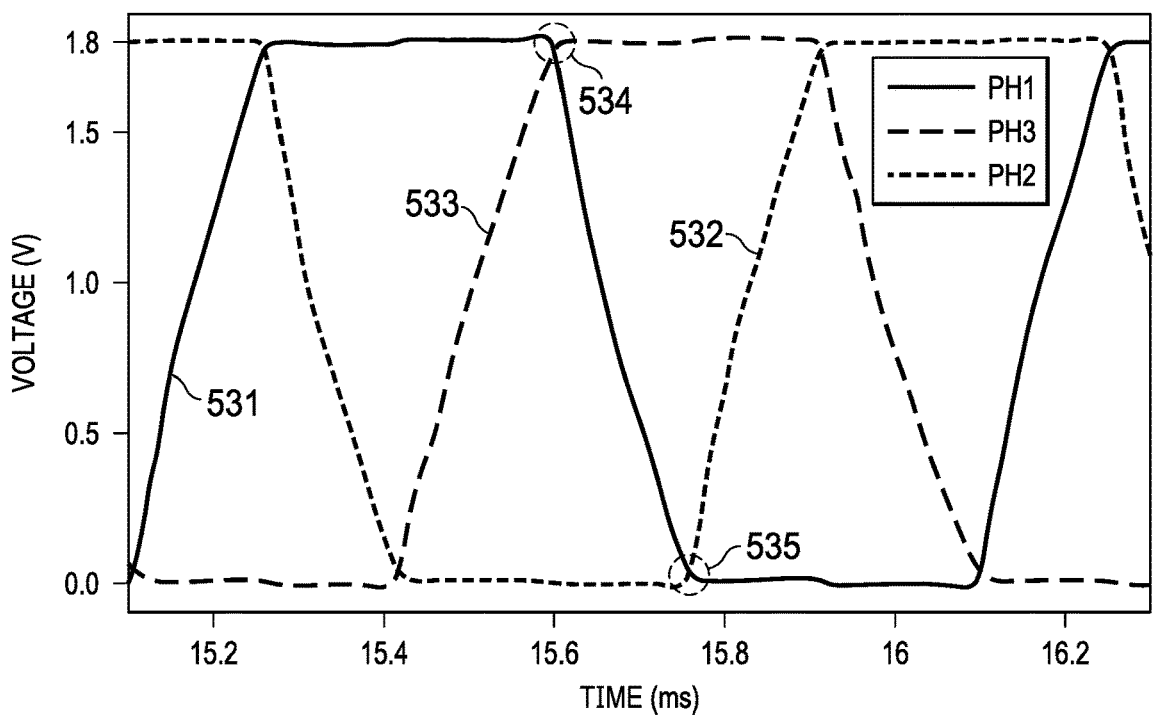
FIG. 5 is plot of voltage vs. time for various phases within the example oscillator.

FIG. 5 is plot of voltage vs. time for three phases PH1 531, PH2 532, and PH3 533 within the oscillator 301 of FIG. 3A. Delay element 311 (FIG. 3A) begins its charging and discharging phases to produce output signal PH2, but only after input signal PH1 reaches the VSS and VDD threshold voltage levels, respectively. Delay element 312 begins its charging and discharging phases to produce output signal PH2, but only after input signal PH2 reaches the VSS and VDD threshold voltage levels, respectively. Similarly, delay element 313 begins its charging and discharging phases to produce output signal PH1, but only after input signal PH3 reaches the VSS and VDD threshold voltage levels, respectively. For example, for Vdd=1.8V and Vss=0.0V, in response to PH3 phase signal 533 reaching approximately 1.8 volts at trigger point 534, delay element 313 is triggered, which causes PH1 phase signal 531 to start falling. Similarly, in response to PH1 phase signal 531 reaching approximately 0.0 volts at trigger point 535, delay element 311 is triggered, which causes PH2 phase signal 532 to start rising.

Figure 6:
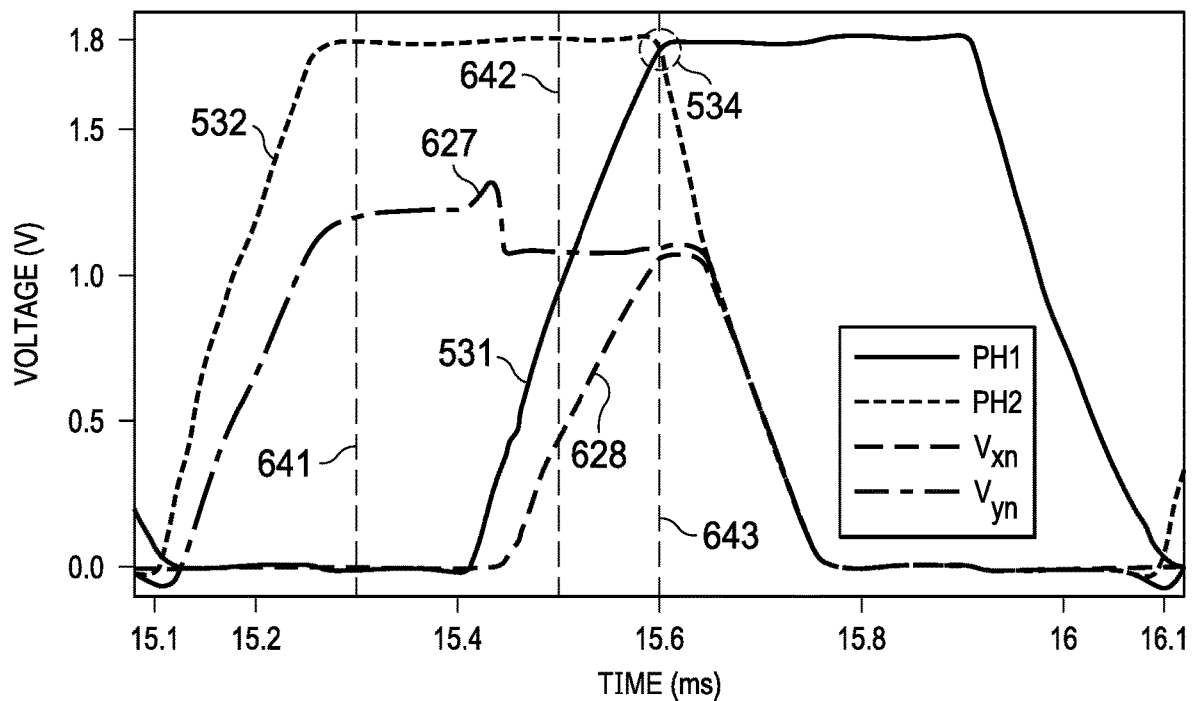
FIG. 6 is plot of voltage vs time illustrating the high threshold of the Schmitt trigger inverters within the example oscillator.

FIG. 6 is plot of voltage vs. time illustrating the high threshold of the Schmitt trigger delay cells within example oscillator 301 of FIG. 3A. In this example, the high threshold point for Schmitt trigger delay cells 311-313 is designed to be approximately equal to the VDD supply voltage. The high threshold operation of Schmitt trigger delay cells 311 is illustrated in FIG. 6; however, Schmitt trigger delay cells 312, 313 operate in a similar manner. A high to low transition in PH2 phase signal 532 is produced by the set of transistors Mn1 to Mn4 of FIG. 3A, in response to PH1 phase signal 531. For a portion of each cycle, such as in the vicinity of time line 641, while PH1 phase signal 531 is at ground potential, PH2 phase signal 532 is held at VDD, internal node 328 (Vxn) of FIG. 3A is at VSS as illustrated by Vxn signal 628, and internal node 327 (Vyn) of FIG. 3A is at (VDD-Vth,n) as shown by Vyn signal 627. In this example, VDD is 1.8V, the n-type gate-source threshold voltage (Vth,n) is approximately 0.6V, and therefore (VDD-Vth,n) is approximately 1.2V. As PH1 signal 531 rises slowly from a VSS level, Vxn node 328 (FIG. 3A) charges to (VDD-Vth,n) through the subthreshold conduction of Mn2, as shown in FIG. 3A and illustrated by Vxn signal 628 in the vicinity of time line 643. Bypass transistor Mn4 (FIG. 3A) provides the needed charging current during this period. In the time duration between time line 641 and time line 643, pull-down transistor Mn3 (FIG. 3A) is in its super cut-off state with a negative gate-source voltage (Vgs), and the PH2 signal 532 is held at VDD.

As PH1 signal 531 voltage rises above (VDD-Vth,n) level as shown at time line 642, pull-down transistor Mn3 (FIG. 3A) begins to enter into a subthreshold region of operation. However, nodes Vyn 327 and PH2 remain undisturbed at (VDD-Vth,n) and VDD, respectively, because the ultra-low bias current (650 pA) required by Mn1 is now provided by transistor Mn2 and bypass transistor Mn4 of FIG. 3A. In response to PH1 signal 531 reaching the VDD level (Vth,n above Vyn voltage) at time line 643, pull-down transistor Mn3 begins to conduct and initiates the discharge phase of PH2 signal 532.

The subthreshold operation of pull-down transistor Mn3 defines the high threshold point 534 of the Schmitt trigger delay cell in this example. Also, in this example, bypass transistor Mn4 (FIG. 3A) is designed to be stronger than transistor pull-down transistor Mn3, in order to keep pull-down transistor Mn3 turned off for a longer period of time. Bypass transistor Mn4 can be made stronger by making the channel width of transistor Mn4 wider than the channel width of pull-down transistor Mn3. To provide an input threshold near Vdd, the channel width of bypass transistor Mn4 should be at least 1.3 times the channel width of pull-down transistor Mn3. In this example, the channel width of bypass transistor Mn4 is approximately three times the channel width of pull-down transistor Mn3. In other examples, an even larger range of difference between bypass transistor Mn4 and pull-down transistor Mn3 may be designed to increase the threshold closer to Vdd.

Figure 7:
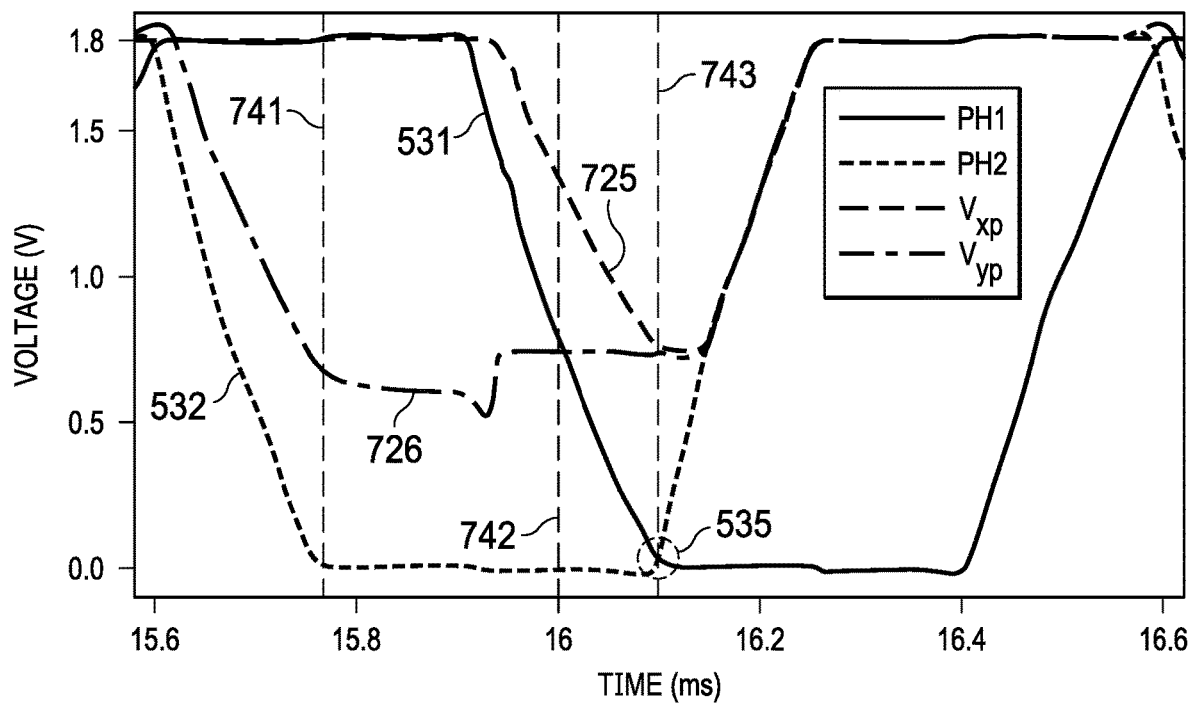
FIG. 7 is plot of voltage vs. time illustrating the low threshold of the Schmitt trigger inverters within the example oscillator.

FIG. 7 is plot of voltage vs. time illustrating the low threshold of the Schmitt trigger delay cells within the oscillator 301 of FIG. 3A. In this example, the low threshold point for Schmitt trigger delay cells 311-313 is designed to be approximately equal to the VSS supply voltage. The low threshold operation of Schmitt trigger delay cell 311 is illustrated in FIG. 7; however, Schmitt trigger delay cells 312, 313 operate in a similar manner. A low to high transition in PH2 phase signal 532 is produced by the set of transistors Mp1 to Mp4 (FIG. 3A) in response to PH1 phase signal 531, in a similar manner to the high to low transition described with reference to FIG. 6.

For a portion of each cycle, such as in the vicinity of time line 741, while PH1 phase signal 531 is at VDD potential, PH2 phase signal 532 is held at Vss, internal node 325 (Vxp) of FIG. 3A is at VDD as shown by Vxp signal 725, and internal node 326 (Vyp) of FIG. 3A is at (VSS+Vth,p) as shown by Vyp signal 726. In this example, VSS is 0.0V, the p-type gate-source threshold voltage (Vth,p) is approximately 0.6V, and therefore (VSS+Vth,p) is approximately 0.6V. As PH1 signal 531 falls slowly from the VDD level, Vxp node 325 (FIG. 3A) discharges to (VSS+Vth,p) through the subthreshold conduction of Mp2 (FIG. 3A), which is illustrated by Vxp signal 725 in the vicinity of time line 743. In the time duration between time line 741 and time line 743, pull-up transistor Mp3 (FIG. 3A) is in its super cut-off state with a positive gate-source voltage (Vgs), and the PH2 signal 532 is held at VSS.

As PH1 signal 531 falls below (VSS+Vth,p) level as shown at time line 742, pull-up transistor Mp3 (FIG. 3A) begins to enter into a subthreshold region of operation. However, nodes Vyp 326 and PH2 remain undisturbed at (VSS+Vth,p) and VSS, respectively, because the ultra-low bias current (650 pA) required by Mp1 is now provided by the transistor Mp2 and bypass transistor Mp4 (FIG. 3A). In response to PH1 signal 531 reaching the VSS level (Vth,p below Vyp voltage) at time line 743, Mp3 begins to conduct and initiates the charging phase of PH2 signal 532.

The subthreshold operation of pull-up transistor Mp3 defines the high threshold point 535 of the Schmitt trigger delay cell 311 in this example. Also, in this example, bypass transistor Mp4 (FIG. 3A) is designed to be stronger than transistor Mp3, in order to keep pull-up transistor Mp3 turned off for a longer period of time. Transistor Mp4 can be made stronger by making the channel width of transistor Mp4 wider than the channel width of transistor Mp3. To provide an input threshold near Vss, the channel width of bypass transistor Mp4 should be at least 1.3 times the channel width of pull-up transistor Mp3. In this example, the channel width of bypass transistor Mp4 is approximately three times the channel width of pull-up transistor Mp3. In other examples, an even larger range of difference between bypass transistor Mp4 and pull-up transistor Mp3 may be designed to increase the threshold closer to Vss.

The oscillation frequency of example oscillator 301 (FIG. 3A) with the CMOS Schmitt trigger delay cells 311-313 is given by expression (2).

$$Fosc = Ibias/(2*N*CL*VDD) \qquad (2)$$

For Ibias=650 pA, load capacitance (CL) of FIG. 3A=60 fF, VDD=1.8 V, N=3, and frequency of oscillation (Fosc) can be calculated from expression (2) to be approximately 1 KHz. According to expression (2), frequency of the proposed oscillator design is sensitive to process and temperature variations only through the Ibias, and is inversely proportional to VDD. In this example, a PTAT current source is used for Ibias, and the supply voltage is allowed to vary from 1.0 V to 3.3 V. High performance applications may use the following at a cost of additional power overhead: a constant bias current source or an Ibias generator that tracks VDD variations, and coarse supply regulation techniques.

Non-Overlap Buffer Circuit

Referring again to FIG. 3A, the PH1, PH2 and PH3 phase signals in ultra-low current oscillator 301 have relatively slow rise and fall times, due to a very low magnitudes of charging and discharging currents. To avoid causing large short circuit currents within digital load circuits in the rest of the sensor system 100 (FIG. 1), the oscillator output signal 340 needs to be buffered strongly to provide faster transition times (on the order of <10 ns) before being provided to those digital load circuits. In this example, a non-overlap buffer configuration 302 provides buffering with no short circuit current flow.

Current starved pre-drivers 341-344 have skewed switching thresholds to generate non-overlapping signals Vn 350 and Vp 351 from phase signal PH1. Pre-driver 341 receives supply current from a voltage supply buss (Vdd) via weak current source 345 that is a p-type MOS transistor. Pre-driver 342 receives supply current from Vdd via weak current source 346 that is a p-type MOS transistor. Weak current source 347 is an n-type MOS transistor that returns current to ground voltage buss (Vss) from pre-driver 343. Weak current source 348 is an n-type MOS transistor that returns current to Vss from pre-driver 344. Each of the weak current sources 345-348 is coupled to bias current generator 303 and is configured to operate as a current mirror to mirror the bias current produced by bias current generator 303. In this example, bias current generator 303 produces a bias current that is approximately 650 pA. This example has two sets of pre-drivers, but another example may have more or fewer pre-drivers to create non-overlapping control signals.

The skewed switching thresholds for pre-drivers 341-344 are caused by the circuit topology with weak current sources 345-348. For example, the switching threshold of pre-driver 341 is reduced from Vdd by the voltage drop produced by weak current source 345. Conversely, the switching threshold of pre-driver 343 is raised from Vss by the voltage drop produced by weak current source 347.

PMOS transistor 352 and NMOS transistor 353 form the output stage of buffer circuit 302 and are driven by non-overlapping control signals 350, 351. Therefore, PMOS transistor 352 and NMOS transistor 353 turn ON at non-overlapping times and avoid short circuit current from VDD to VSS. This operation also provides relatively fast signal transitions to the final inverter stages 354 in this example.

Figure 8:
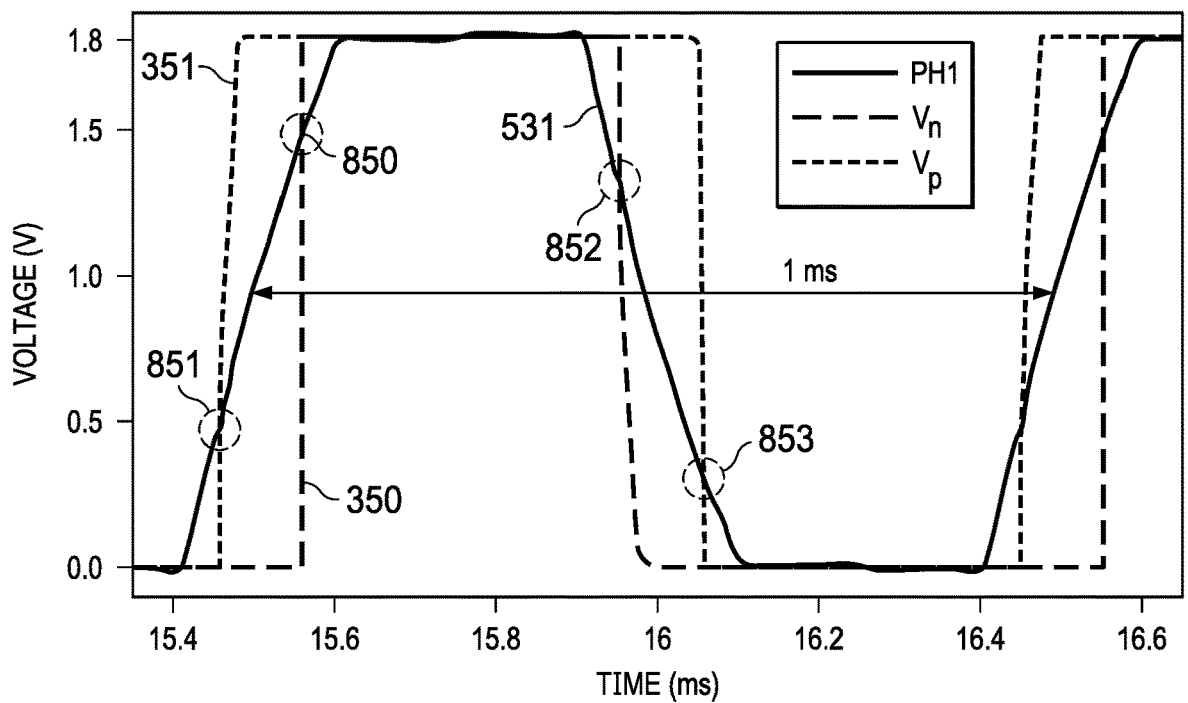
FIG. 8 is plot of voltage vs. time for non-overlap control signals in the output buffer of FIG. 3B.

FIG. 8 is plot of voltage vs. time for non-overlap control signals Vn 350 and Vp 351 (FIG. 3B) in the output buffer 302 (FIG. 3B). As phase signal PH1 531 rises from Vss, pre-driver 341 switches at low threshold 851 to cause control signal Vp 351 to switch from a low level to high level. Approximately 0.1 ms later, pre-driver 343 switches at high threshold level 850 to cause control signal Vn 350 to switch from a low level to a high level. As phase signal 531 falls from Vdd, pre-driver 343 switches at high threshold level 852 to cause control signal Vn 350 to switch from the high level to a low level. Approximately 0.1 ms later, pre-driver 341 switches at low threshold 853 to cause control signal Vp 351 to switch from the high level to a low level. In this manner, non-overlapping control signals cause pull-up transistor 352 and pull-down transistor 353 (FIG. 3B) to switch in a manner that prevents both of them against turning ON at the same time, so no short circuit current will flow through them.

In this example, non-overlap buffer circuit 302 (including the final inverter stages 354 of FIG. 3B) consumes a total average current of approximately 500 pA and provides an output signal transition time less than 10 ns with a load capacitance (CLoad) 355 of approximately 50 if.

Test Results

An example ultra-low power oscillator circuit as described herein was fabricated in a 130 nm CMOS process. The oscillator occupies an active area of 0.027 mm2 (177 μm×152 μm). At room temperature, the test oscillator example (including bias generation, oscillator core, and non-overlap buffer) consumes a total current of 2.8 nA from 1.8 V supply voltage to generate a 1 KHz clock signal (5 pJ/cycle). The bias current generator consumes a 1.3 nA (2*Ibias) current. The oscillator core consumes 975 pA (3*Ibias/2) of current. The non-overlap buffer circuit consumes a current of 525 pA. The test oscillator example circuit achieves an ultra-low energy performance of 1.16 pJ/cycle at a 1 V supply voltage, consuming 2.18 nA current to generate a 1.87 KHz frequency of oscillation. The example oscillator design operates across a wide supply voltage range of 1.0 V to 3.3 V, and a temperature range of −40° C. to 125° C.

Figure 9:
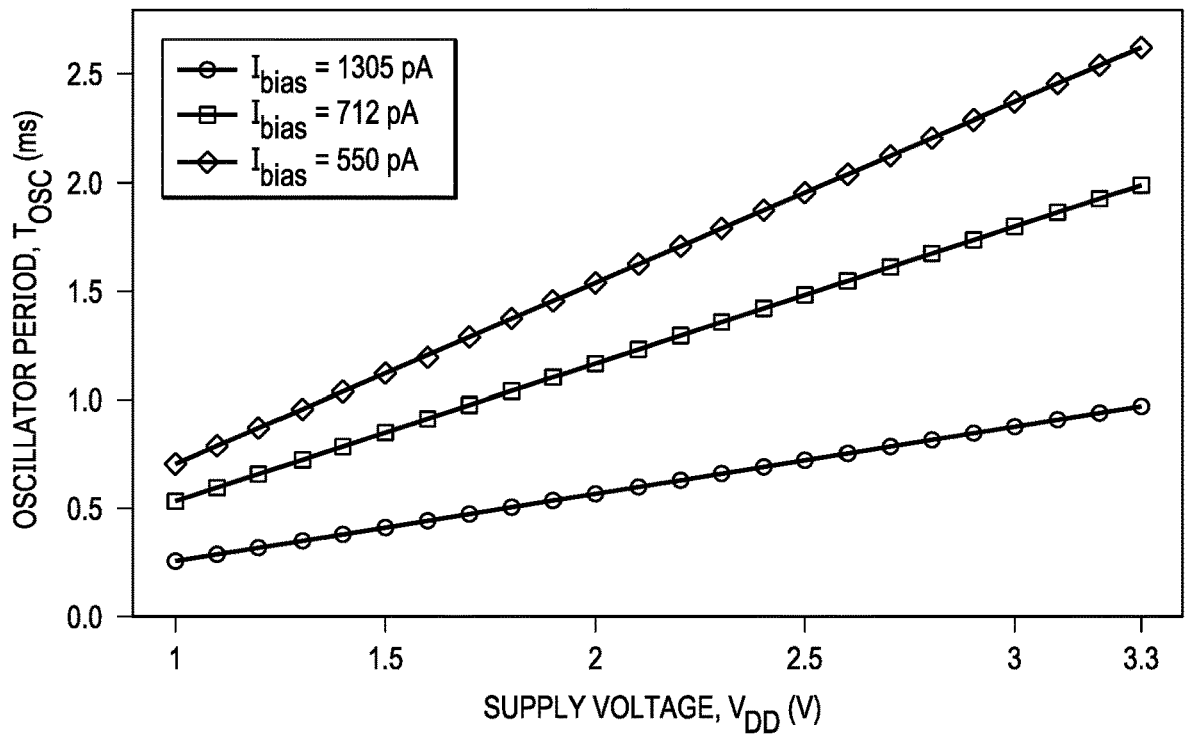
FIG. 9 is plot of oscillator period vs. supply voltage for output signal of the example oscillator.
Figure 10:
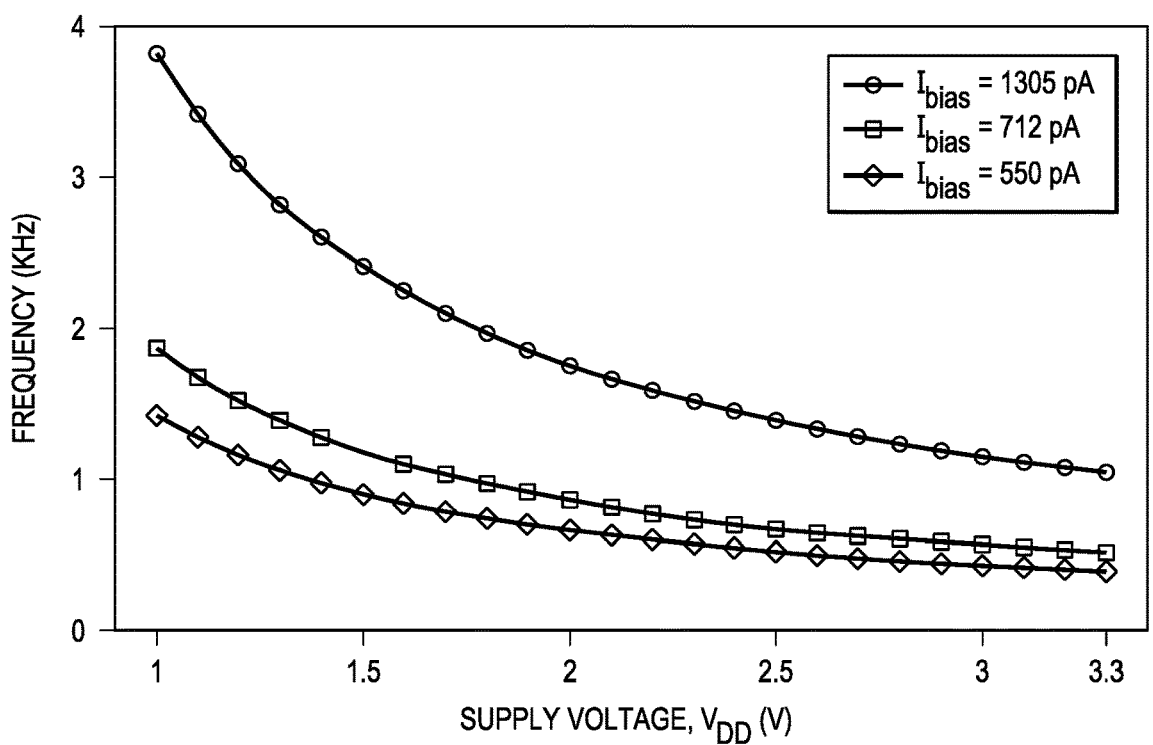
FIG. 10 is plot of frequency vs. supply voltage for the example oscillator.

FIG. 9 is plot of oscillator period vs. supply voltage for the output signal of the test oscillator example. FIG. 10 is plot of frequency vs. supply voltage for the test oscillator example. The measured frequency versus supply voltage characteristics agrees with expression (2) hereinabove. Effect of Ibias on the time period/frequency and current consumption of the oscillator circuit are measured under three different Ibias settings of 550 pA, 712 pA and 1305 pA. Frequency of oscillation is inversely proportional to VDD. The test oscillator example circuit has a measured supply voltage dependence of 0.0613%/mV over the supply voltage range of 1.0 V to 3.3 V, which is acceptable in the relaxed performance applications of many sensor systems. For stringent application requirements, a pseudo Vdd regulation may be added to the example design at a cost of additional power consumption.

Figure 11:
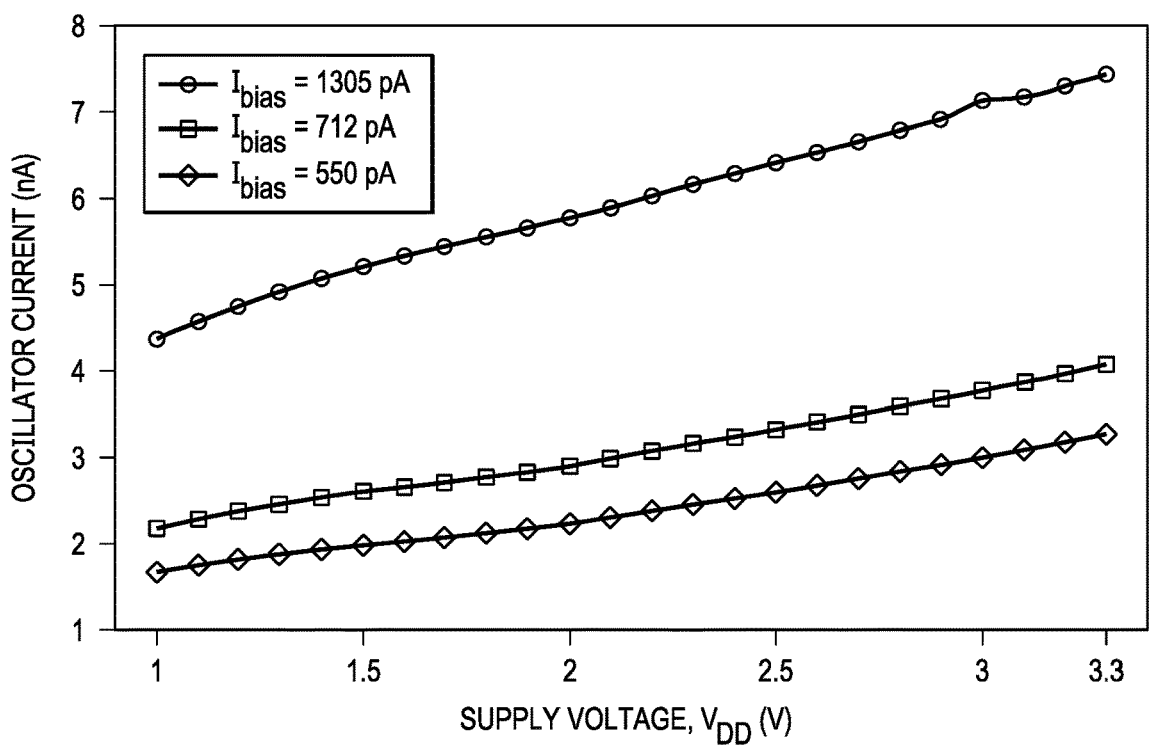
FIG. 11 is plot of oscillator current vs. supply voltage for the example oscillator.

FIG. 11 is plot of oscillator current vs. supply voltage for the test oscillator example. The oscillator current consumption increases with the supply voltage, due to a reduction in the non-overlap time window in the output buffer circuit.

Figure 12:
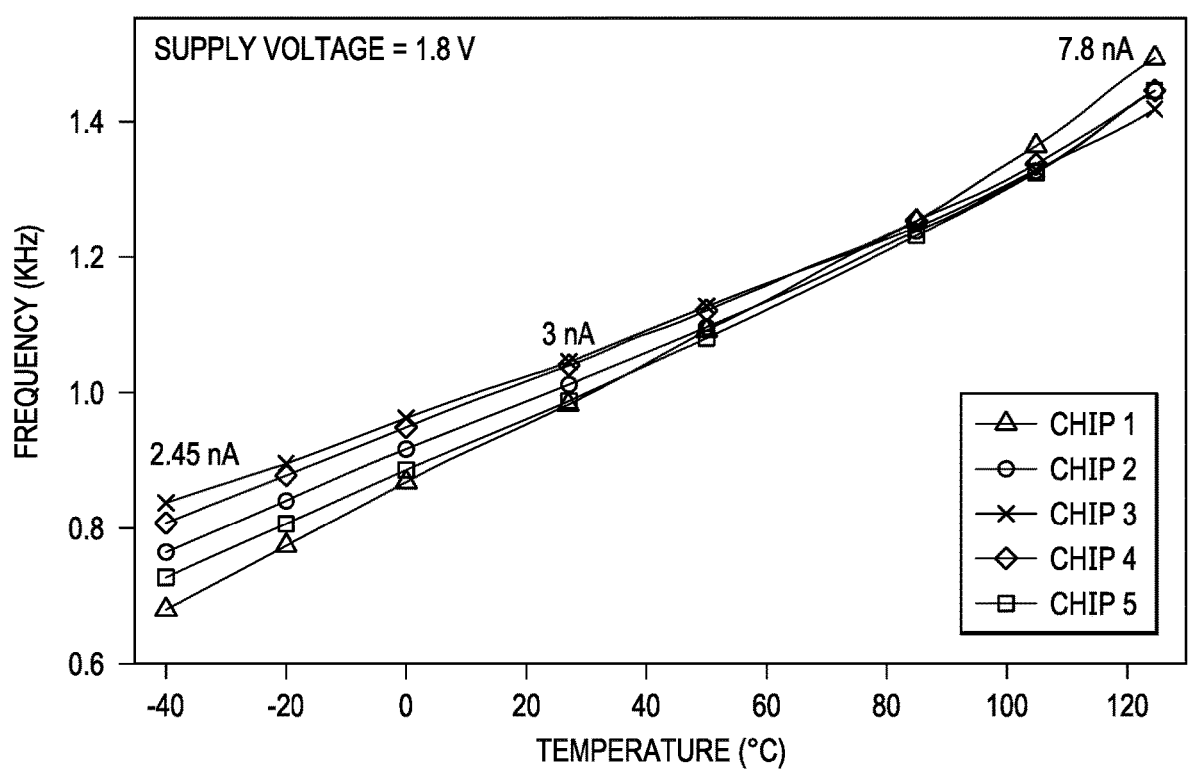
FIG. 12 is plot of frequency vs. temperature for the example oscillator.

FIG. 12 is a plot of the frequency versus temperature characteristics of the test oscillator example circuit measured from five chips. The measured frequency rises almost linearly with the temperature, due to a PTAT characteristic of the bias current in this example and shows a temperature sensitivity of 0.417%/° C. The oscillator consumes a total current of 2.45 nA, 3 nA and 7.8 nA at −40° C., 27° C. and 125° C., respectively, from a 1.8V supply.

Figure 13:
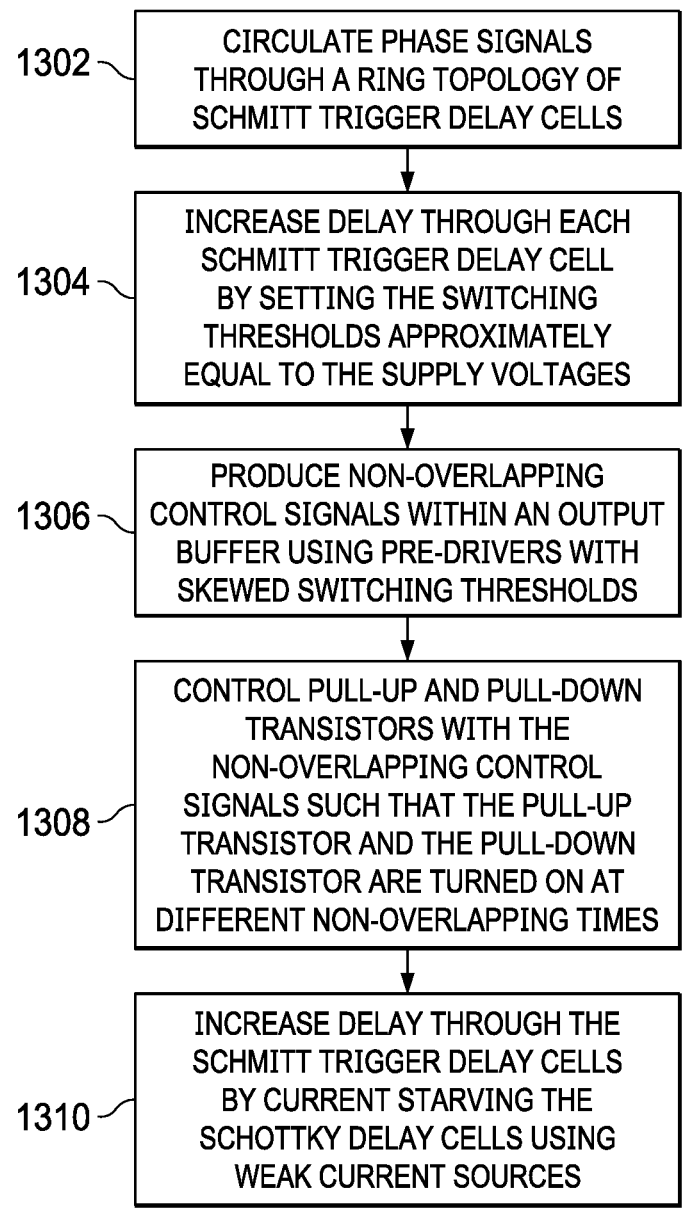
FIG. 13 is a flow diagram of operation of an example ultra-low power oscillator.

FIG. 13 is a flow diagram of operation of an example ultra-low power oscillator as described in more detail herein. At 1302, phase signals (such as PH1, PH2 and PH3 of FIG. 3A) are circulated through a ring topology of Schmitt trigger delay cells, such as Schmitt trigger delay cells 311-313 (FIG. 3A).

At 1304, delay through each Schmitt trigger delay cell is increased by setting the switching threshold approximately equal to the supply voltage that is used to power the Schmitt trigger delay cells. This may be done by bypassing the pull up and pull-down transistors with bypass transistors to keep the pull-up and pull-down transistors turned off until the input signal reaches the Vdd or Vss supply voltage, as described in more detail in with regard to FIG. 6 and FIG. 7.

At 1306, non-overlapping control signals are produced within an output buffer by using pre-drivers that have skewed switching thresholds and are coupled to receive one of the phase signals. In this example, the weak current sources coupled to the Vdd and Vss supply bus provide an extra voltage drop that skews the thresholds of the respective pre-driver, as described in more detail with regard to FIG. 8.

At 1308, a pull-up and a pull-down transistor in an output stage of output buffer are controlled with the non-overlapping control signals in a manner that prevents the pull-up transistor and the pull-down transistor against being turned on at the same time. In this manner, a short circuit current is prevented from passing through the pull-up transistor and the pull-down transistor, as described in more detail with regard to FIG. 8.

At 1310, delay through the Schmitt trigger delay cells may be further increased by current starving the Schmitt trigger delay cells. This may be done using weak current sources that mirror an ultra-low bias current, as described in more detail with regard to weak current sources 314 and 317 (FIG. 3A).

System Example

Referring again to FIG. 1, oscillator 300 (FIG. 3A, 3B) may be coupled to sensors 102, AFE 103, MCU/DSP 104 and/or wireless interface logic 105 for use as a clock signal by the various circuit blocks. Sensors 102 may be any of a variety of known or later developed circuits or interfaces to sense external conditions, parameters, signals, etc. Processing logic 104 may be coupled to control operations of sensing logic 102. Also, system 100 may include additional interface logic and storage circuitry.

Wake-up timer 101, sensors 102, AFE 103, MCU/DSP 104, wireless interface 105 and power management logic 108 may all be fabricated on a semiconductor substrate and formed into an integrated circuit (IC) chip using known or later developed semiconductor fabrication techniques. Each IC chip may be mounted on a lead frame or direct mounted on another substrate and packaged in a protective enclosure using known or later developed IC packaging techniques.

Energy storage 107 provides energy to oscillator 300 and to the other circuitry within system 100. Energy storage 107 device may be a battery in some examples. In other examples, energy storage 107 may be a capacitor or inductor that is charged by energy scavenging from the surrounding environment, such as by near field coupling, light energy, thermal energy, vibration energy, etc. Low power operation of oscillator 300 conserves power available from energy storage 107. In some examples, the IC chip may include energy harvesting logic 106. In other examples, an energy harvesting device may be coupled to the packaged IC chip. In some examples, energy storage device 107 may be fabricated on the IC chip as a capacitor. In other examples, a battery 107 may be coupled to the packaged IC chip.

Thus, an ultra-low energy, KHz oscillator circuit suitable for heavily duty cycled applications is described herein. The example KHz oscillator employs an ultra-low current biasing scheme, larger delay generation techniques and non-overlap buffer circuits to reduce the oscillator total power consumption. A chip prototype of the proposed circuit was fabricated in a 130 nm CMOS process. The oscillator achieves an ultra-low energy performance of 1.16 pJ/cycle, consuming a 2.18 nA current from 1 V supply to generate 1.87 KHz frequency of oscillation. The performance of the ultra-low power example was verified across a wide supply voltage range of 1.0 V to 3.3 V, and a temperature range of −40° C. to 125° C.

OTHER EXAMPLES

In described examples, an oscillator circuit includes a non-overlapped buffer. In another example, a low power non-overlapped buffer as described may be used alone in another application to receive a signal having a relatively slow transition rate and convert it to a signal having a relatively fast transition rate with a low power consumption.

In described examples, a Schmitt trigger ring topology oscillator circuit is followed by a non-overlapping buffer to convert a phase signal having a relatively slow transition rate into a clock signal having a relatively fast transition rate. In another example, a Schmitt trigger ring topology oscillator circuit as described herein may be used without a non-overlapping buffer, such as where digital logic short circuit current is not an issue.

In another example, a Schmitt trigger ring topology oscillator circuit as described may be used with another type of buffer.

In described examples, the Schmitt trigger delay cells are connected to Vdd and Vss voltage supplies. Other examples may have different supply voltages, such as Vss and −Vdd. References herein to a "high threshold" and a "low threshold" are relative. For example, in a Vss/−Vdd system, the "high threshold" would refer to Vss, and the "low threshold" would refer to −Vdd.

To further reduce total current consumption, example embodiments perform current starving of the Schmitt trigger delay cells and non-overlap output buffer using weak current sources. In another example, current starving may be omitted on some or all of the cells.

In the example described herein, an ultra-low bias current of approximately 650 pA is generated to control the weak current sources. In another example, a higher or a lower bias current may be generated and used as described herein, with a corresponding change in total current consumption.

In the example described herein, the oscillator output signal is referred to as a "clock signal" that may be used to clock other digital logic. In another example, the oscillator output signal may be used as a frequency signal for another application besides clocking digital logic.

The examples described herein include a sensor system. In other examples, an ultra-low power oscillator as described herein may be used in other types of systems to provide a low frequency periodic signal for various applications, such as: a wake up function, a clock signal, a low frequency periodic signal, and other applications.

In example embodiments, the term "approximately" means that a value or range of values is either a stated value or range of values or within plus or minus 10% from that stated value or range of values.

In this description, the term "couple" and derivatives thereof mean an indirect, direct, optical, and/or wireless electrical connection. Thus, if a first device couples to a second device, that connection may be through a direct electrical connection, through an indirect electrical connection via other devices and connections, through an optical electrical connection, and/or through a wireless electrical connection.

Modifications are possible in the described examples, and other examples are possible, within the scope of the claims.

What is claimed is:

1. An integrated circuit (IC) comprising:
a first voltage terminal configured to receive a supply voltage;
a second voltage terminal configured to receive a ground voltage;
an oscillator coupled to the first voltage terminal and to the second voltage terminal, the oscillator comprising:
a current-starved ring oscillator core that includes a set of stages, wherein each stage of the stages includes:
a first bias transistor;
a second bias transistor; and
a Schmitt trigger delay cell, wherein the Schmitt trigger delay cell has a load capacitance, a first switching threshold approximately equal to the supply voltage, and a second switching threshold approximately equal to the ground voltage, the Schmitt trigger delay cell comprising:
a first terminal coupled to the first bias transistor;
a second terminal coupled to the second bias transistor;
an output terminal;
a first transistor and a second transistor coupled serially between the first terminal and the output terminal and having a first node therebetween;
a third transistor coupled between the first node and the second voltage terminal;
a fourth transistor and a fifth transistor coupled serially between the output terminal and the second terminal and having a second node therebetween; and
a sixth transistor coupled between the second node and the first voltage terminal;
wherein a frequency of the oscillator is directly proportional to a biasing current of the oscillator and inversely proportional to a number of stages in the set of stages, the load capacitance, and the supply voltage; and
an output buffer comprising:
an input terminal coupled to the output terminal of the current-starved ring oscillator core;
an output terminal;
one or more current-starved pre-drivers coupled to the input terminal and having skewed switching thresholds to generate non-overlapping control signals; and
an output stage coupled to the one or more current-starved pre-drivers and to the output terminal of the output buffer, the output stage configured to reduce a signal transition time of an oscillator output signal based on the non-overlapping control signals.

2. The IC of claim 1, further comprising a bias generator configured to generate the biasing current, wherein the bias generator comprises at least one transistor configured to operate in a subthreshold region and coupled to the first bias transistor and the second bias transistor, wherein the first bias transistor and the second bias transistor are configured to mirror the biasing current.

3. The IC of claim 1, further comprising processing logic coupled to control a sensor, wherein a wakeup timer is coupled to the processing logic, and the wakeup timer includes the oscillator.

4. The IC of claim 1, wherein the IC is mounted on a lead frame and encapsulated by a mold compound.

5. The IC of claim 1, wherein:
the first transistor has a source coupled to the first terminal, a drain coupled to the first node, and a control gate connected to the input terminal of the Schmitt trigger delay cell;
the second transistor has a source connected to the first node, a drain coupled to the output terminal of the Schmitt trigger delay cell, and a control gate connected to the input terminal of the Schmitt trigger delay cell, wherein characteristics of a subthreshold operation region of the second transistor set the second switching threshold approximately equal to the ground voltage; and
the third transistor has a source connected to the first node, a drain connected to the second voltage terminal, and a control gate connected to the output terminal of the Schmitt trigger delay cell, wherein the third transistor has a larger channel width than the second transistor.

6. The IC of claim 5, wherein:
the fourth transistor has a source coupled to the second voltage terminal, a drain coupled to the second node, and a control gate connected to the input terminal of the Schmitt trigger delay cell;
the fifth transistor has a source connected to the second node, a drain coupled to the output terminal of the Schmitt trigger delay cell, and a control gate connected to the input terminal of the Schmitt trigger delay cell, wherein characteristics of a subthreshold operation region of the fifth transistor set the first switching threshold approximately equal to the supply voltage;
the sixth transistor has a source connected to the second node, a drain connected to the first voltage terminal, and a control gate connected to the output terminal of the Schmitt trigger delay cell, wherein the sixth transistor has a larger channel width than the fifth transistor;
the first transistor, the second transistor, and the third transistor are transistors of a first type; and
the fourth transistor, the fifth transistor, and the sixth transistor are transistors of a second type.

7. The IC of claim 5, wherein the channel width of the third transistor is at least 1.3 times greater than a channel width of the second transistor.

8. The IC of claim 5, further comprising a capacitor having the load capacitance and comprising: a first terminal connected the output terminal; and a second terminal coupled to the second voltage terminal.

9. The IC of claim 1, the output buffer comprising:
a pull-up transistor coupled to the first voltage terminal;
a pull-down transistor coupled to the second voltage terminal; and
wherein the one or more current-starved pre-drivers comprises:
a pull-up pre-driver coupled to the input terminal of the output buffer, to the pull-up transistor, and to the first voltage terminal, wherein the pull-up pre-driver is configured to turn off the pull-up transistor in response to a signal at the input terminal of the output buffer rising above a first voltage level; and
a pull-down pre-driver coupled to the input terminal of the output buffer, to the pull-down transistor, and to the second voltage terminal, wherein the pull-down pre-driver is configured to turn on the pull-down transistor in response to the signal at the input terminal of the output buffer rising above a second voltage level, the second voltage level being higher than the first voltage level.

10. The IC of claim 9, wherein:
the pull-down pre-driver is connected to turn off the pull-down transistor in response to the signal falling below a third voltage level; and
the pull-up pre-driver is connected to turn on the pull-up transistor in response to the signal falling below a fourth voltage level that is lower than the third voltage level by a particular amount.

11. The IC of claim 10, wherein:
the pull-up pre-driver includes a seventh transistor coupled to the first voltage terminal and connected in series with an eighth transistor and a complementary ninth transistor, the ninth transistor being coupled to the second voltage terminal, wherein a gate of the eighth transistor and a gate of the ninth transistor are connected to receive the signal, and a gate of the pull-up transistor is coupled to a node between the eighth and ninth transistors; and
the pull-down pre-driver includes a tenth transistor coupled to the second voltage terminal and connected in series with an eleventh transistor and a complementary twelfth transistor, the twelfth transistor being coupled to the first voltage terminal, wherein a gate of the eleventh transistor and a gate of the twelfth transistor are connected to receive the signal, and a gate of the pull-down transistor is coupled to a node between the eleventh and twelfth transistors.

12. An integrated circuit (IC) comprising:
a first voltage terminal configured to receive a supply voltage;
a second voltage terminal configured to receive a ground voltage; and
a current-starved ring oscillator that includes a set of stages, wherein each stage of the set of stages includes a Schmitt trigger delay cell having an input terminal and an output terminal and a load capacitance, wherein:
the Schmitt trigger delay cell is coupled to a first bias transistor and to a second bias transistor,
the Schmitt trigger delay cell is configured to receive a biasing current from the first bias transistor and the second bias transistor;
the Schmitt trigger delay cell has a first input threshold approximately equal to the supply voltage and a second input threshold approximately equal to the ground voltage;
the Schmitt trigger delay cell comprises:
a first transistor and a second transistor coupled serially between the first bias transistor and the output terminal and having a first node therebetween;
a third transistor coupled between the first node and the second voltage terminal;
a fourth transistor and a fifth transistor coupled serially between the output terminal and the second bias transistor and having a second node therebetween; and
a sixth transistor coupled between the second node and the first voltage terminal; and
a frequency of the current-starved ring oscillator is directly proportional to the biasing current and inversely proportional to a number of stages in the set of stages, the load capacitance, and the supply voltage.

13. The IC of claim 12, wherein:
the first transistor comprises a source coupled to the first voltage terminal, a drain coupled to the first node, and a control gate connected to the input terminal;
the second transistor comprises a source connected to the first node, a drain coupled to the output terminal, and a control gate connected to the input terminal, wherein characteristics of a subthreshold operation region of the second transistor set the second input threshold approximately equal to the ground voltage; and
the third transistor comprises a source connected to the first node, a drain connected to the second voltage terminal, and a control gate connected to the output terminal, wherein the third transistor has a larger channel width than the second transistor;
the first transistor, the second transistor, and the third transistor comprise a pull-up circuit coupled to the output terminal; and
a pull-down circuit coupled to the output terminal and comprising the fourth transistor, the fifth transistor, and the sixth transistor.

* * * * *